US005637536A

United States Patent [19]
Val

[11] Patent Number: 5,637,536
[45] Date of Patent: Jun. 10, 1997

[54] METHOD FOR INTERCONNECTING SEMICONDUCTOR CHIPS IN THREE DIMENSIONS, AND COMPONENT RESULTING THEREFROM

[75] Inventor: Christian Val, St Remy les Chevreuse, France

[73] Assignee: Thomson-CSF, Paris, France

[21] Appl. No.: 416,704

[22] PCT Filed: Aug. 5, 1994

[86] PCT No.: PCT/FR94/00986

§ 371 Date: Apr. 13, 1995

§ 102(e) Date: Apr. 13, 1995

[87] PCT Pub. No.: WO95/05677

PCT Pub. Date: Feb. 23, 1995

[30] Foreign Application Priority Data

Aug. 13, 1993 [FR] France .................... 93-09964

[51] Int. Cl.⁶ ...................................... H01L 21/60
[52] U.S. Cl. ......................... 438/686; 257/723; 438/108
[58] Field of Search .......................... 437/209, 208, 437/210, 211, 214, 215, 219, 220; 257/685, 686, 723, 724, 725, 726

[56] References Cited

U.S. PATENT DOCUMENTS

| 3,239,719 | 3/1966 | Shower . | |
|---|---|---|---|
| 3,746,934 | 7/1973 | Stein . | |
| 4,408,256 | 10/1983 | Val . | |
| 4,413,170 | 11/1983 | Val et al. . | |
| 4,518,818 | 5/1985 | Le Ny et al. . | |
| 4,525,921 | 7/1985 | Carson et al. . | |
| 4,546,028 | 10/1985 | Val . | |
| 4,553,020 | 11/1985 | Val . | |
| 4,559,579 | 12/1985 | Val . | |
| 4,639,826 | 1/1987 | Val et al. . | |
| 4,654,694 | 3/1987 | Val . | |
| 4,755,910 | 7/1988 | Val . | |
| 4,868,712 | 9/1989 | Woodman . | |
| 4,956,695 | 9/1990 | Robinson et al. | 257/686 |
| 5,002,895 | 3/1991 | Leparquier et al. . | |
| 5,075,253 | 12/1991 | Sliwa, Jr. | 437/208 |
| 5,104,820 | 4/1992 | Go et al. | 437/208 |
| 5,138,438 | 8/1992 | Masayumi et al. | 257/723 |
| 5,198,888 | 3/1993 | Sugano et al. | 437/208 |
| 5,237,204 | 8/1993 | Val . | |
| 5,239,199 | 8/1993 | Chiu | 257/723 |
| 5,323,533 | 6/1994 | Val . | |
| 5,343,366 | 8/1994 | Cipolla et al. | 257/686 |
| 5,400,218 | 3/1995 | Val . | |
| 5,461,545 | 10/1995 | Leroy et al. . | |

FOREIGN PATENT DOCUMENTS

| 0354708 | 1/1989 | European Pat. Off. . | |
|---|---|---|---|
| 59-205747 | 11/1984 | Japan | 437/208 |

OTHER PUBLICATIONS

IBM Technical Disclosure Bulletin; vol. 17, No. 3, 1974, New York US pp. 655–656 B. Aimi.

*Primary Examiner*—Kevin Picardat
*Attorney, Agent, or Firm*—Oblon, Spivak, McClelland, Maier & Neustadt, P.C.

[57] ABSTRACT

A method and component resulting from interconnecting wafers in three dimensions, where the wafers include chips and the chips include pads. Steps in the method include connecting leads to the pads; stacking the wafers; embedding the stack by a selectively removable material; treating faces of the stack in order to reveal the leads; forming connections on the faces of the stack for interconnecting the leads; and removing the selectively removable material.

21 Claims, 7 Drawing Sheets

METHOD FOR INTERCONNECTING SEMICONDUCTOR CHIPS IN THREE DIMENSIONS, AND COMPONENT RESULTING THEREFROM

This is the U.S. national application of PCT/FR94/00986 filed on Aug. 5, 1994.

BACKGROUND OF THE INVENTION

1. Field of the Invention

The subject of the present invention is a process for interconnecting semiconductor chips in three dimensions, as well as the electronic component resulting therefrom, each of the chips containing, for example, an electronic component, an integrated circuit, or a sensor, the whole being able to constitute for example a micromachine.

2. Discussion of Background

The construction of current electronic systems, both civil and military, must take into account ever greater demands of compactness, owing to the ever higher number of circuits employed.

With this in mind, it has already been proposed to construct stacks of so-called "three-dimensional" (3D) integrated circuits, as described for example in French Patent Application No. 2,670,323 in the name of Thomson-CSF. According to this construction, the semiconductor chips are stacked after having been provided with connection wires oriented towards the lateral faces of the stack, and then they are consolidated together by embedding, for example in a resin; the interconnections of the chips are then made on the faces of the stack.

SUMMARY OF THE INVENTION

The purpose of the present invention is to modify this process so as to allow the resulting 3D component to meet stricter specifications for harsh environments, in space for example. This is achieved, in particular, by avoiding the semiconductor chips being finally embedded in a resin, this allowing, on the one hand, better performance at high frequency and, on the other hand, a lessening of the mechanical stresses exerted on the chips during temperature variations.

More precisely, according to the process of the invention, wafers, each including one or more semiconductor chips, are provided with leads, wires for example, connected to the pads of the chips and oriented towards the lateral faces of the stack, then the chips are stacked and embedded in a material capable of being selectively removed subsequently; next, the faces of the stack are treated so as to reveal the cross-sections of the above leads, connections intended to interconnect the cross-sections of these leads electrically are formed on the faces of the stack, and then the embedding material is selectively removed.

BRIEF DESCRIPTION OF THE DRAWINGS

Other subjects, features and results of the invention will emerge from the following description given by way of example and illustrated by the appended drawings which represent:

FIG. 2b, a partial sectional view of FIG. 2a;

In these various figures, the same references relate to the same elements. Furthermore, for clarity, the drawings are not to true scale. Likewise, for simplicity described below is the case in which the stacked wafers each contain just a single semiconductor chip, but the invention is of course applicable to the case in which the wafers, or substrates, contain several chips.

DESCRIPTION OF THE PREFERRED EMBODIMENTS

Figure 1:
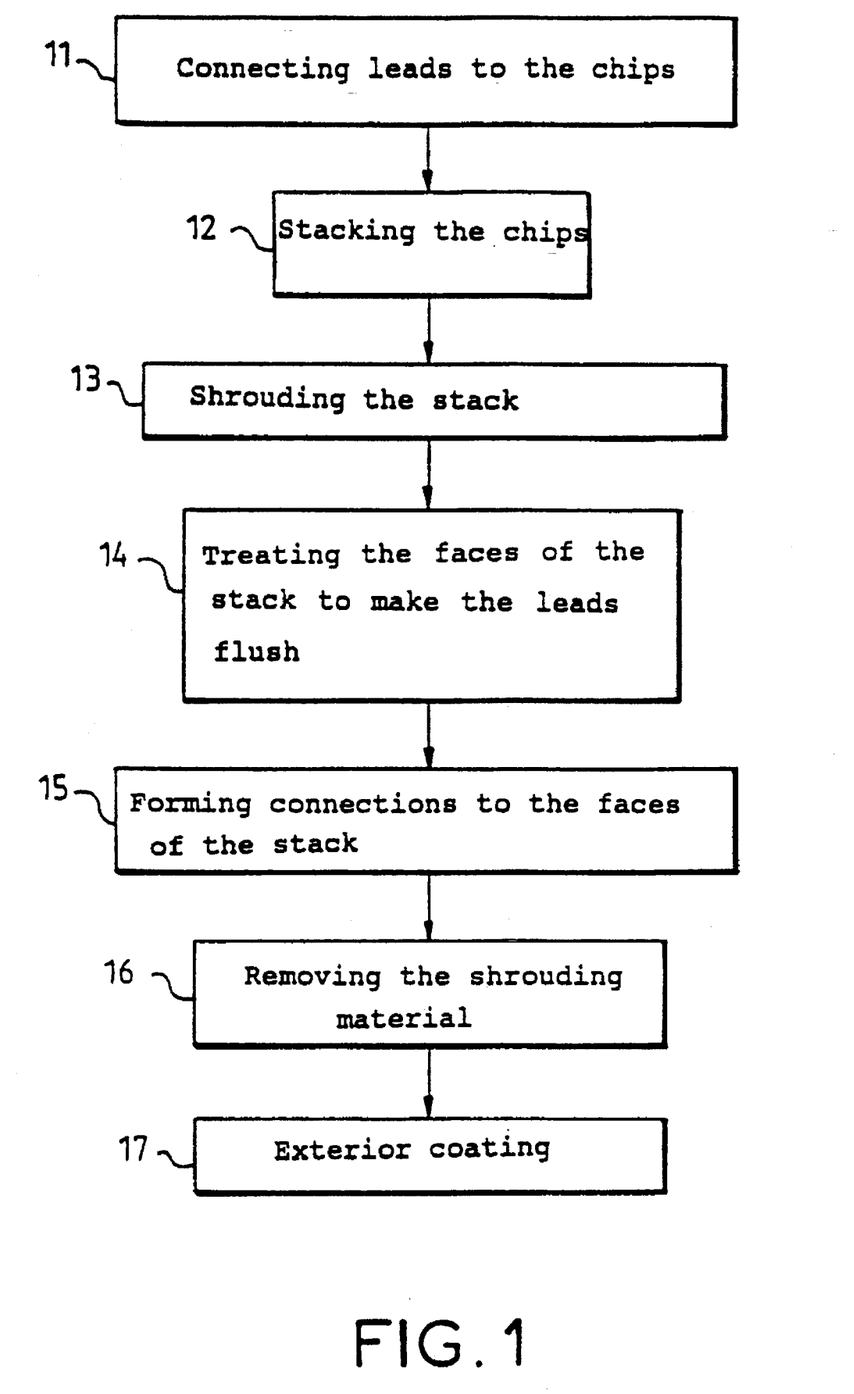
FIG. 1, one embodiment of the method according to the invention.

FIG. 1 therefore illustrates one possible embodiment of the method according to the invention.

The first step, labelled 11, consists in electrically connecting leads to each of the pads of the semiconductor chips intended to make up the stack.

This step can be carried out in various ways.

Figure 2A:
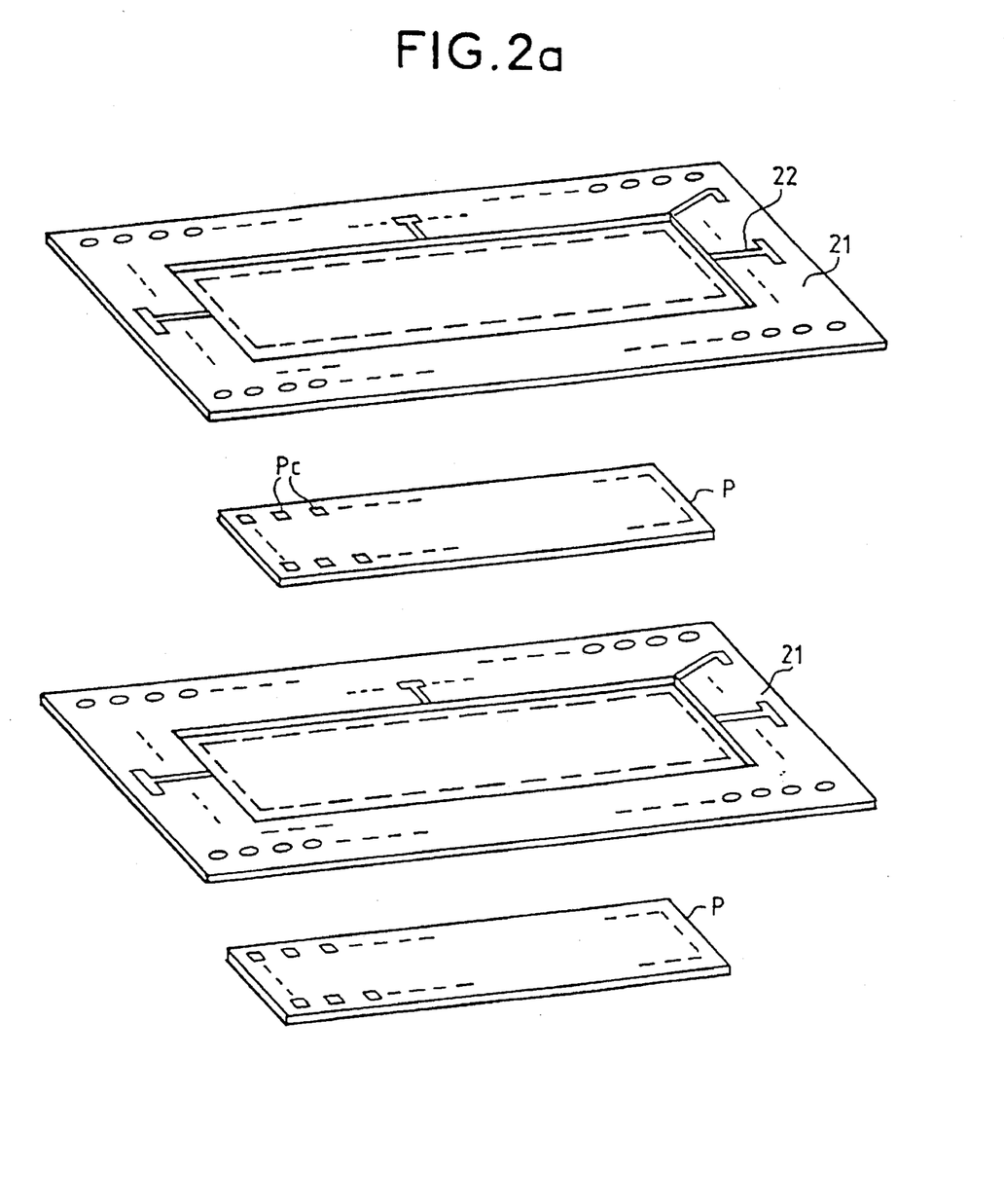
FIG. 2a, an exploded perspective view of an embodiment of the first steps of the method according to the invention.
Figure 2B:
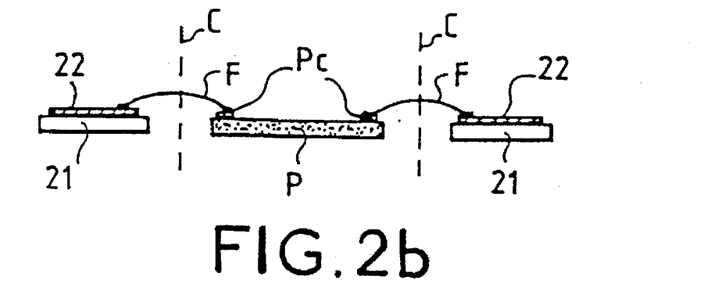

A first embodiment is represented in FIGS. 2a and 2b, FIG. 2a being an exploded perspective view of several chips, for example two, and of their connection means, FIG. 2b being a sectional view of a single chip and of its connection means.

Represented therefore in FIG. 2a are two chips labelled P. Any integrated circuit, a memory for example, is made for example in each of these chips. Pads $P_c$, arranged for example as represented in the figure, appear on the surface of the chip P near two of the edges of the chip, or else over the whole of the surface of one of the faces of the chip; these pads $P_c$ allow electrical connection of the circuit contained in the chip to the outside.

The connection means of each of the chips comprise: an electrically insulating substrate or film 21 in the form of a frame, the chip P being intended to occupy the centre of the frame; conducting depositions, or tracks, 22 arranged on the substrate 21, and lastly electrical leads F, such as wires or strips, connected between the pads $P_c$ of the chip and the tracks 22 of the substrate 21.

Figure 3:
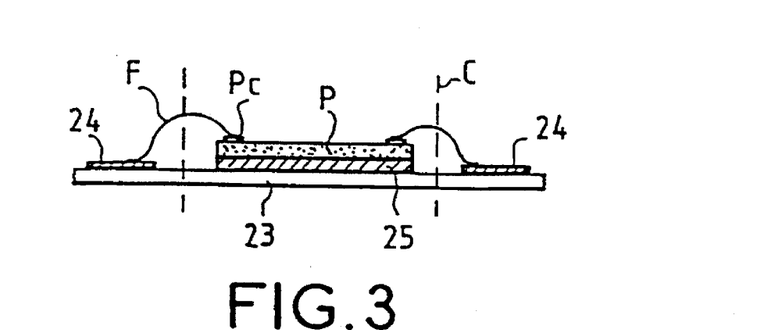
FIGS. 3, 4, 5a and 5b, various embodiments of the first step of the method according to the invention.

FIG. 3 represents, likewise seen in section, another embodiment of the connection means of a chip P.

According to this embodiment, an electrically insulating substrate, labelled 23, now in the form of a plate rather than a frame, on which is arranged the chip P, possibly by way of a conducting layer 25 is likewise used.

As before, the substrate 23 carries metallized leads, or tracks 24, and each of the pads $P_c$ of the chip P is linked to a track 24 by means of a lead F, wire for example.

Figure 4:
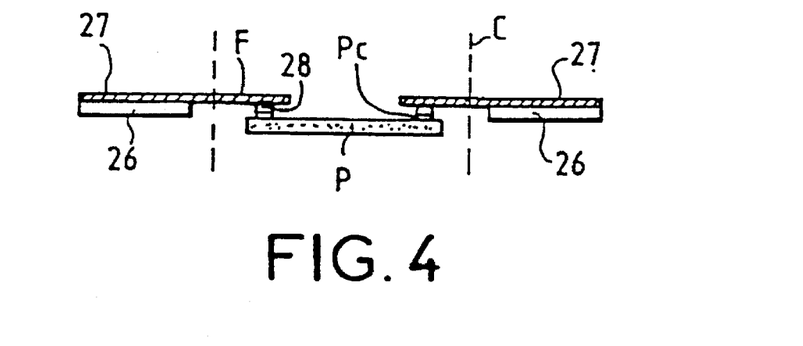

FIG. 4 represents yet another embodiment of the connection means of the pads of the semiconductor chips.

Visible again in this figure is a chip P with its pads $P_c$. Connection is effected here according to a technique known by the name of TAB (for Tape Automatic Bonding); according to this technique, the chip P is surrounded by an electrically insulating film 26 in the form of a frame, the film 26 carrying relatively rigid electrically conducting strips 27 overhanging the frame 26 so as to come right in line with the pads $P_c$, the portion of the strips 27 extending beyond the frame 26 playing the role of the above leads F. The pads $P_c$ are reinforced by an additional conducting layer 28 to form a bump, and all the bumps are connected to the strips 27 in one or more operations.

In the diverse embodiments illustrated in FIGS. 2a to 4, the insulating substrates (21, 23, 26) carrying the leads F are for example made from an organic material.

Figure 5A:
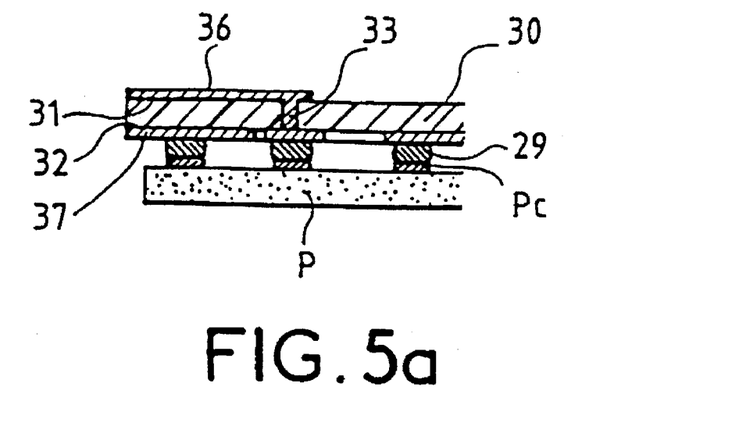

FIG. 5a illustrates another embodiment of the connecting of the leads to the pads of the chips P.

Represented in section in this figure is a chip P carrying pads Pc distributed for example over the entire upper surface of the chip. Each of the pads $P_c$ is covered with an extra thickness of conducting material 29 to form a bump. The connection means of this chip P here consist of an electrically insulating support carrier 30, made for example from ceramic (alumina, aluminium nitride or diamond for example), which carries leads in the form of metallic depositions 36 and 37 on the lower 32 and upper 31 surfaces of the support 30, these two surfaces communicating for example by way of metallized holes 33 made through the thickness of the support 30. The leads 36 and 37 are connected to the bumps 29 and thus link the pads $P_c$ to the periphery of the support 30.

In this embodiment, it is the tracks 36 and 37 which play the role of the above leads F. For simplicity, hereafter "leads" will denote the leads F or the tracks 36, 37 indiscriminately.

The next step (12) of the process according to the invention consists in stacking the chips, provided with their connection means, one above the other. If need be, spacers or shims are added to the stack, between the chips.

Figure 5B:
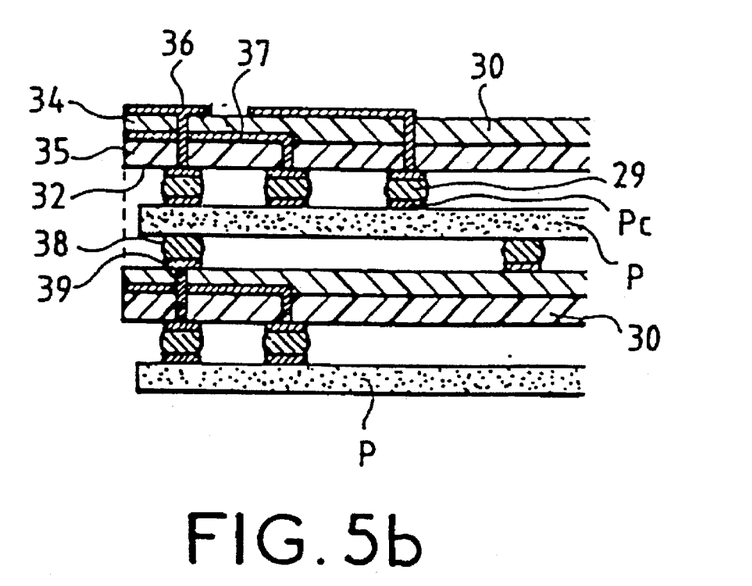

FIG. 5b represents for example a stack of two chips P and of their connection means in the case where the latter are made as illustrated in FIG. 5a.

Visible again therefore in FIG. 5b are two chips P, each carrying on their upper face pads $P_c$ linked to the tracks carried by a support 30, by way of bumps 29. By way of example, the support 30 can be multilayer, here consisting of two layers 34 and 35, so as to facilitate the routing of the connections, the leads 36 and 37 being situated respectively on the upper surface and on the intermediate surface of the support 30, thus leaving the lower face 32 free of any tracks.

Likewise by way of example, the lower face of the chip P, that which does not carry the pads $P_c$, is likewise provided with metallic bumps 38; the latter are intended to come opposite metallic pads 39 carried by the support 30 of the chip underneath, this assembly being intended to facilitate the centring of the chips and of the supports, for, as is known, when the elements 38 and 39 are brought to their melting point, the surface tension forces which are created there prompt their automatic alignment (self-centring).

The advantage of this embodiment is, apart from the possibilities of self-centring, the high density of pads which it allows on the chip.

The next step (13, FIG. 1) consists in embedding the previously obtained stack with the aid of a material which is capable of being selectively removed subsequently.

Such a material can be an organic material, such as a resin, a photosensitive resin for example. If need be, the embedding material can be polymerized so as to endow it with a minimum of mechanical cohesion, provided that this polymerization does not prevent its subsequent removal.

Figure 6:
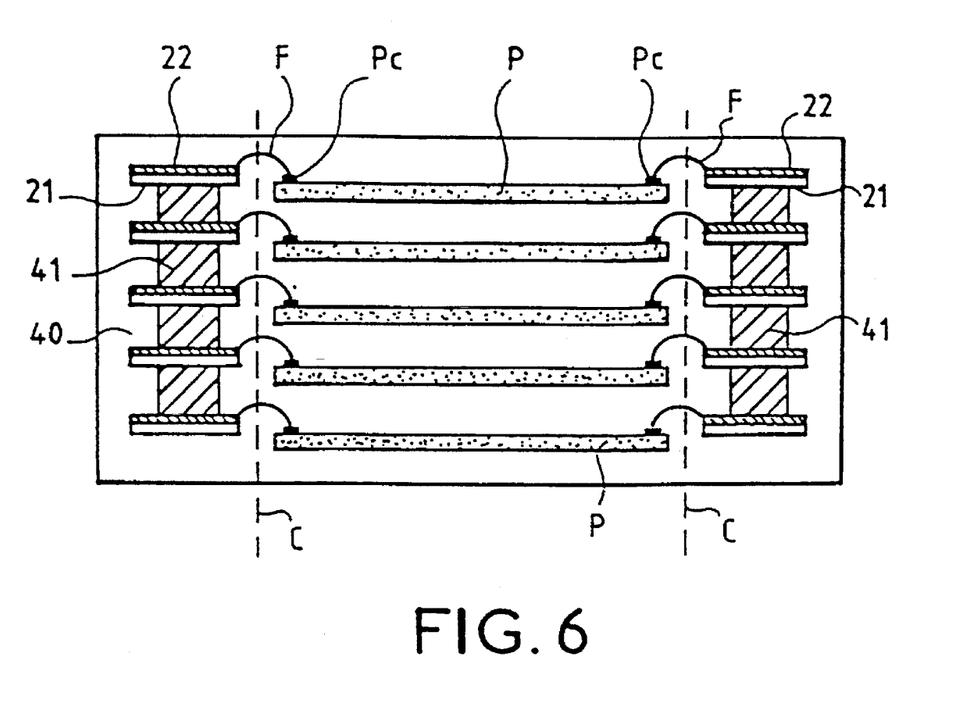
FIG. 6, a sectional view of the stack obtained on the basis of one of the above embodiments.

FIG. 6 illustrates the result of such an operation, in the case for example in which step 11 has been carried out as illustrated in FIGS. 2a and 2b.

Represented in FIG. 6 is a stack of five chips P for example, each being surrounded by an insulating frame 21 carrying tracks 22, to which the pads $P_c$ of the chips P are connected by way of wires F. In this example, shims or spacers 41 are arranged between the frames 21. The whole is shrouded and embedded in a material 40, such as a resin, which, although seen in section, has not been hatched for the clarity of the diagram. In a variant embodiment, the shims 41 can be arranged between the chips P themselves, thus remaining in the final stack. This variant can be advantageous in order to mechanically stiffen the final stack and/or contribute to its thermal adaptation.

The next step (14, FIG. 1) consists in treating the faces of the stack, by slicing or polishing depending on the embodiment, so as to reveal on the lateral faces of the stack the cross-section of the leads (leads F or tracks 36–37) which are connected to the pads $P_c$ of the chips P.

In the embodiment illustrated in FIGS. 2b, 3, 4 or 6, this treatment consists in slicing along the dashed line C, that is to say level with the leads F between the pads $P_c$ of the chips P and the tracks to which these leads are connected at their other end. It is seen more particularly in FIG. 6 that the slicing has the effect of eliminating the spacers 41 and the frames 21, leaving no organic material remaining in the stack other than the embedding material 40, subsequently removed. This is true for the embodiments of FIGS. 2 and 4.

In the embodiment illustrated in FIGS. 5a or 5b, this step 14 can consist either as before of a slicing, or of a simple polishing, so as to reveal the cross-section of the tracks 36 and 37.

Figure 7:
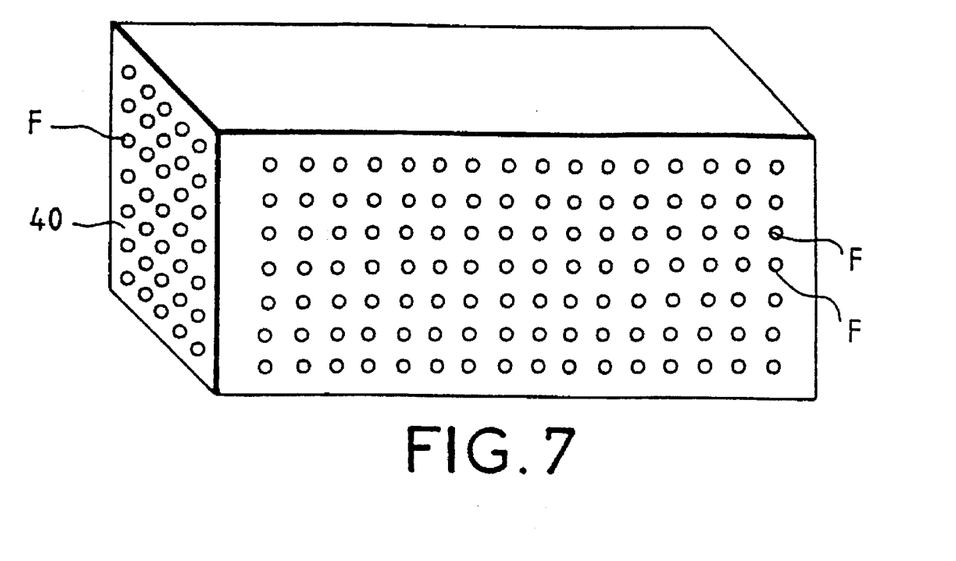
FIG. 7, the stack obtained after slicing its faces.

The result of this operation is illustrated in FIG. 7.

The stack obtained after slicing is for example of rectangular parallelepipedal shape as represented in the figure, but it may also be of non-rectangular parallelepipedal shape, of right or oblique cylindrical or any other shape. The outer surfaces of the stack are constituted by the embedding material 40, flush with which, in the middle are the cross-sections of the leads (F, 36, 37), which cross-sections are represented as circular for example in the case of wires but which may assume any other shape, rectangular for example in the case of strips.

The following step (15, FIG. 1) consists in making, upon the exterior surfaces of the stack, connections electrically linking the cross-sections of the leads (F, 36, 37).

These connections can be made in various ways: for example, by depositing a conducting layer, metallic for example, by any known means (chemical or electrochemical deposition, vacuum deposition . . . ), and then etching this layer to make the connections, with the aid of a laser as described for example in the aforesaid Patent Application, or by photolithography. They may also be made by directly depositing conducting tracks, by silk-screen printing or with the aid of a laser; according to this latter technique, the stack is dipped in an organo-metallic material which is then removed except on the portions illuminated with a laser, in accordance with the pattern desired for the connections: as is known, the laser, by modifying the chemical bonds between the constituents of the organo-metallic material, enables the metal to adhere to the stack; it is thus possible to deposit for example palladium or copper; in the case in which the thicknesses obtained are insufficient, it is possible to increase them by overlaying, according to any known technique.

In a variant embodiment, steps 14 and/or 15 are carried out in such a way that the leads (F, 36, 37) are not flush with but project from the lateral surface of the stack. This can be carried out for example by forming pits or depressions in the lateral surface, around the said leads, or else grooves joining up several leads, for example with the aid of a laser or as described below. This variant embodiment makes it possible to facilitate the connections of step 15 and/or to improve the quality thereof. By way of example, to reinforce the electrical contact between the connections of step 15 and the cross-section of the leads (F, 36, 37) in the case in which the embedding material is a photosensitive resin, grooves are formed as follows. After step 14, the leads are flush with the lateral faces of the stack. The photosensitive resin is then irradiated in accordance with the pattern desired for the connections, the resin being chosen appropriately so that only the irradiated portion is attacked during a subsequent dissolution phase: a shallow groove (which may typically be of the order of about 10 micrometres) is thereby obtained in accordance with the connection pattern, exposing the end of the leads. The connections made next will be able to adhere to the whole of the end of the leads, and not only to their cross-section.

The next step (16, FIG. 1) consists in selectively removing the embedding material 40.

This is done with the aid of specific solvents, liquid or gas. By way of example, it is possible to use acetone or an oxygen plasma to remove a photosensitive resin.

Figure 8A:
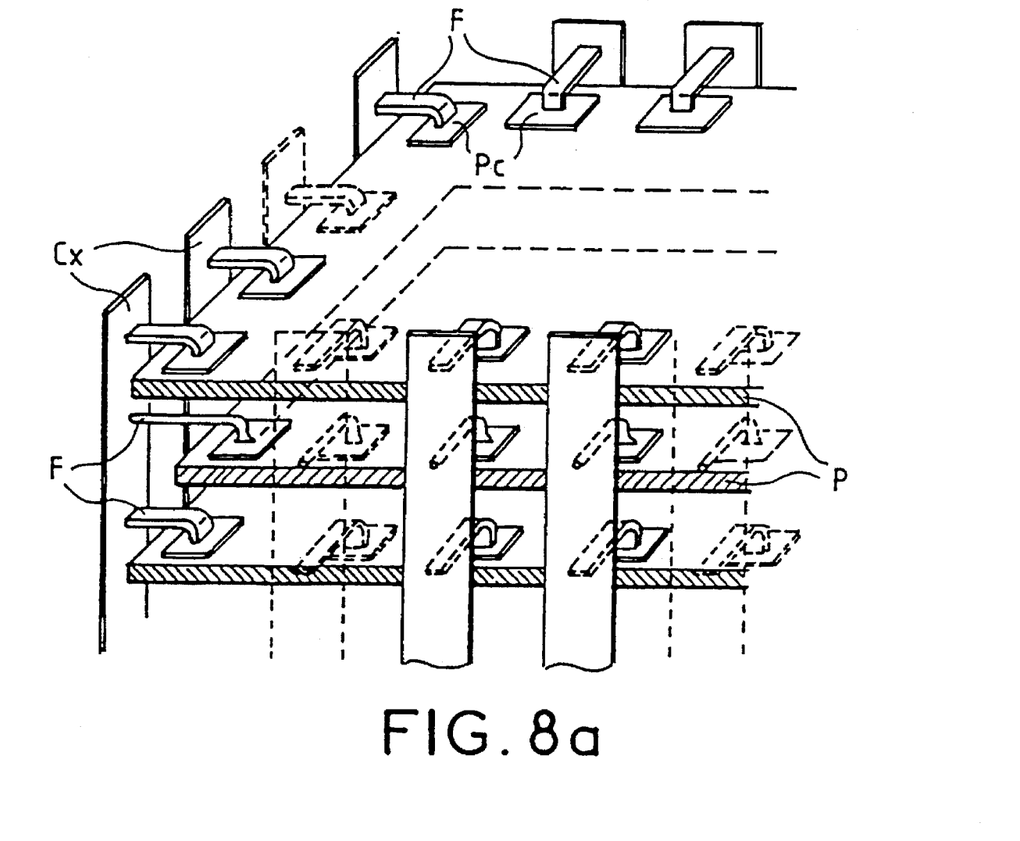
FIGS. 8a and 8b, two variant embodiments of the stack obtained after removing the embedding material.

FIG. 8a is a partial perspective view of the stack after removing the embedding material, still by way of example in the case of the embodiment illustrated in FIGS. 2a and 2b.

Seen therefore in FIG. 8a are three chips P and a few of their pads $P_c$ to which leads F are connected; by way of illustration, represented in the same diagram are leads F in the form of wires and strips, it being understood that in general a stack is constructed together with wires only or strips only. The leads F are linked together by vertical connections $C_x$, in the form of strips of greater width for example.

Figure 8B:
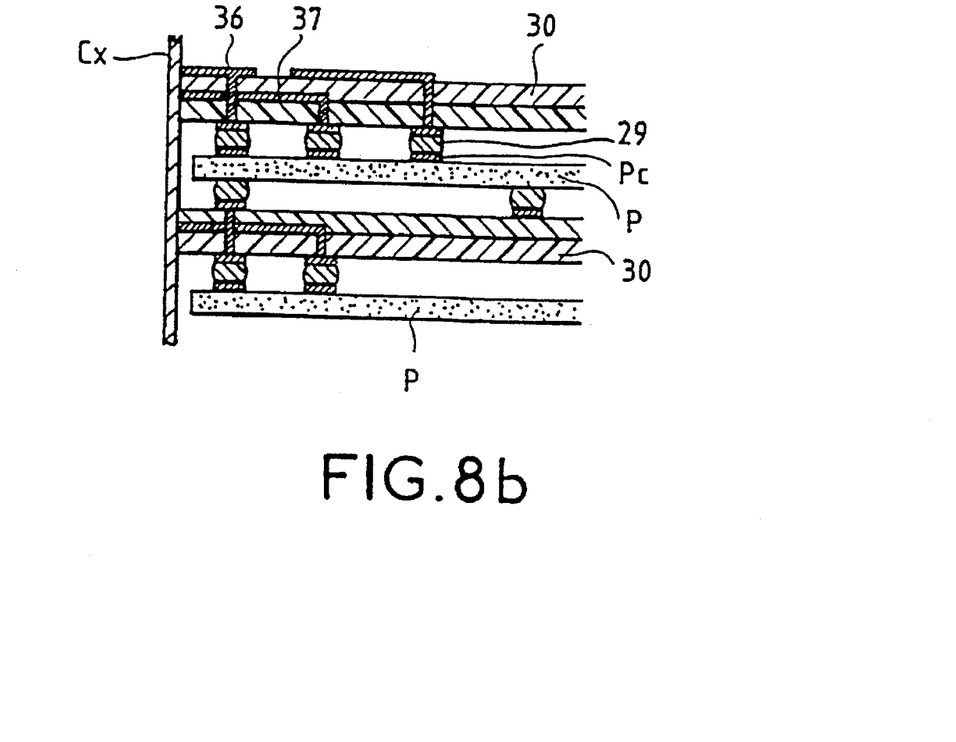

FIG. 8b is similar to 8a but for the embodiment of FIGS. 5a or 5b.

The tracks 36 and/or 37 are linked together by a vertical connection $C_x$ which furthermore rests upon the insulating substrates 30.

Figure 8C:
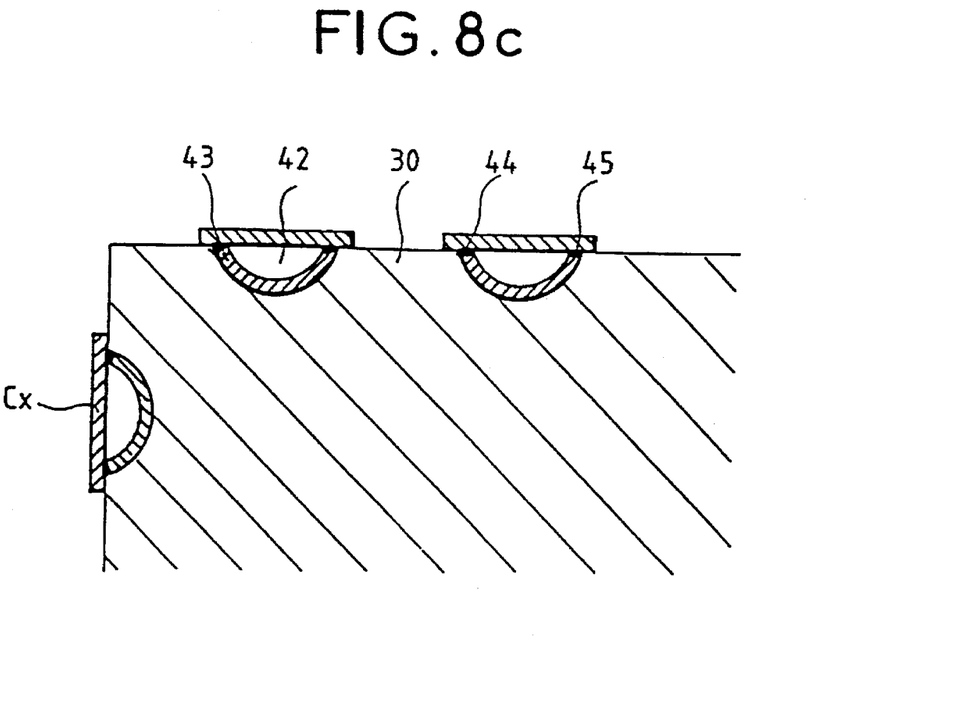
FIG. 8c, a variant of the above figure.

In a variant embodiment, illustrated in FIG. 8c, which is a sectional view of a support 30 in a plane parallel to the support, when it is desired to make vertical connections between the leads or tracks 36, 37, the insulating supports 30 can be provided with metallized (43) and aligned half-holes 42, also termed castellations.

Electrical contact will be effected with the vertical connection $C_x$ along the two edges 44 and 45 of the metallization 43, thus allowing better electrical contact as a result of the increase in the areas of the cross-sections in contact.

A stack is thereby obtained in which the embedding material has been removed and which, in these particular embodiments, is divested of any organic material, the chips here being carried mechanically by their electrical connections (F, 36, 37, $C_x$) and, as appropriate, the substrates (3) carrying these connections, possibly with the aid of spacers (41).

According to a variant embodiment, the method according to the invention can include an additional step (17, FIG. 1) during which the previously obtained stack is coated externally with an electrically insulating, preferably mineral, layer, silicon oxide for example, the functions of which are principally to prevent corrosion and reinforce the mechanical cohesion of the assembly. This insulating layer can be deposited for example chemically, in a plasma-activated gas phase; this technique is known by the name PECVD (for Plasma Enhanced Chemical Vapor Deposition) and it has the advantage that it can be carried out at low temperature (100° to 150° C., typically).

A component resulting from the stacking in three dimensions of semiconductor chips which are mechanically secured together but contain no embedding material or organic adhesive has thus been described. This feature makes it possible to incorporate within the stack wafers carrying micro-motors or sensors including moving parts. Another advantage thereof is better mechanical cohesion under temperature variations, for the coefficients of thermal expansion of the semiconductor materials and of the organic embedding materials are in general very different, giving rise to stresses which may even cause rupture of the semiconductor chips. The component according to the invention can therefore be used in environments which require high reliability and/or are subject to significant temperature variations. Furthermore, the various leads being, according to the invention, surrounded by air rather than by embedding material, the values of the stray capacitances between leads, which depend on the value of the dielectric constant ($\epsilon$) of the medium situated between the leads (typically $\epsilon=4$ for epoxy resin, whereas $\epsilon=1$ for air), are much lower, thus permitting operation of the components at much higher frequency. Lastly, of course, the mass of the 3D component without embedding material or, if appropriate, support parts, is reduced relative to a component of the same type which includes these.

What is claimed as new and desirable to be secured by Letters Patent of the United States is:

1. Method for interconnecting wafers in three dimensions, the wafers comprising one or more semiconductor chips, the chips comprising pads for interconnecting them, the process being characterized by the fact that it comprises the following steps in succession:

connecting leads (F) to the pads ($P_c$) of the wafers;

stacking the wafers (P);

embedding the stack by means of a selectively removable material;

treating the faces of the stack in order to reveal the leads;

forming connections ($C_x$) on the faces of the stack, for interconnecting the leads;

removing the selectively removable material.

2. Method according to claim 1, characterized by the fact that, during the first step, each of the wafers (P) is arranged inside a frame of electrically insulating material, carrying conducting depositions; that the leads (F) are connected between the pads ($P_c$) and the conducting depositions, and that, during the fourth step, the faces of the stack are treated so as to eliminate the frame.

3. Method according to claim 1, characterized by the fact that, during the first step, each of the wafers (P) is arranged on a plate of electrically insulating material, the plate carrying conducting depositions, and that the leads (F) are connected between the pads ($P_c$) and the conducting depositions.

4. Method according to claim 1, characterized by the fact that, during the first step, each of the wafers (P) is arranged inside a frame of electrically insulating material, the frame carrying conducting strips extending (F) beyond the frame so as to come above the pads ($P_c$) and being connected to the latter, and that, during the fourth step, the faces of the stack are treated so as to eliminate the frame.

5. Method according to claim 1, characterized by the fact that, during the first step, the pads ($P_c$) of each of the wafers are covered with bumps, that an electrically insulating substrate is arranged above the face of the wafer which carries the pads, that the substrate carries metallic depositions on its upper and lower faces, which depositions are linked to the bumps, and that, during the fourth step, the faces of the stack are treated so as to make the metallic depositions flush.

6. Method according to claim 5, characterized by the fact that each of the wafers (P) further comprises a second series of bumps made on that one of its faces which does not carry pads ($P_c$), and that the substrate assigned to the neighbouring wafer within the stack carries pads intended to be connected to the bumps of the second series.

7. Method according to claim 5, characterized by the fact that the substrates each comprise metallized half-holes made on their lateral faces, where the connections ($C_x$) of the stack are made and intended to be in contact with them.

8. Method according to claim 1, characterized by the fact that, during the fifth step, grooves are formed in the stack in accordance with the pattern of the connections ($C_x$), the grooves exposing the end of the leads.

9. Method according to claim 1, characterized by the fact that spacers are arranged between the wafers during stacking.

10. Method according to claim 1, characterized by the fact that it further comprises a step of coating the stack with an electrically insulating layer of a mineral material.

11. Method according to claim 6, characterized by the fact that the substrates each comprise metallized half-holes made on their lateral faces, where the connections of the stack are made and intended to be in contact with them.

12. Method according to claim 2, characterized by the fact that it further comprises a step of coating the stack with an electrically insulating layer of a mineral material.

13. Method according to claim 3, characterized by the fact that it further comprises a step of coating the stack with an electrically insulating layer of a mineral material.

14. Method according to claim 4, characterized by the fact that it further comprises a step of coating the stack with an electrically insulating layer of a mineral material.

15. Method according to claim 5, characterized by the fact that it further comprises a step of coating the stack with an electrically insulating layer of a mineral material.

16. Method according to claim 6, characterized by the fact that it further comprises a step of coating the stack with an electrically insulating layer of a mineral material.

17. Method according to claim 7, characterized by the fact that it further comprises a step of coating the stack with an electrically insulating layer of a mineral material.

18. Method according to claim 8, characterized by the fact that it further comprises a step of coating the stack with an electrically insulating layer of a mineral material.

19. Method according to claim 9, characterized by the fact that it further comprises a step of coating the stack with an electrically insulating layer of a mineral material.

20. A self-supporting component comprising:
a wafer stack comprising,
a first wafer comprising,
a first chip comprising a first pad, and
a first chip carrier configured to support said first chip, and
a second wafer disposed over said first wafer, comprising,
a second chip comprising a second pad, and
a second chip carrier configured to support said second chip, and wherein said wafer stack has a face surface;
a first lead connected to the first pad and extending to said face surface of said wafer stack;
a second lead connected to the second pad and extending to said face surface of said wafer stack; and
a connector arranged on the face surface of the wafer stack and interconnecting said first lead and second lead, said connector configured to structurally support said wafer stack, whereby said component is made self-supporting by said connection of said first lead and said second lead to said wafer stack and by said connector interconnecting said first and the second lead.

21. A self-supporting component comprising:
a wafer stack comprising,
a first wafer comprising,
a first chip comprising a first pad, and
a second wafer disposed over said first wafer, comprising,
a second chip comprising a second pad;
a first lead connected to the first pad and extending to said face surface of said wafer stack;
a second lead connected to the second pad and extending to said face surface of said wafer stack; and
a connector arranged on the face surface of the wafer stack and interconnecting said first lead and second lead, said connector configured to structurally support said wafer stack, whereby said component is made self-supporting by said connection of said first lead and said second lead to said wafer stack and by said connector interconnecting said first and the second lead.

* * * * *